(12) United States Patent
Takazane

(10) Patent No.: US 10,734,783 B2
(45) Date of Patent: Aug. 4, 2020

(54) LASER OSCILLATOR

(71) Applicant: FANUC CORPORATION, Yamanashi (JP)

(72) Inventor: Tetsuhisa Takazane, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/396,934

(22) Filed: Apr. 29, 2019

(65) Prior Publication Data
US 2019/0341738 A1 Nov. 7, 2019

(30) Foreign Application Priority Data
May 7, 2018 (JP) ................................. 2018-089131

(51) Int. Cl.
| H01S 3/13 | (2006.01) |
| H01S 3/30 | (2006.01) |
| H01S 3/081 | (2006.01) |
| H01S 3/067 | (2006.01) |

(52) U.S. Cl.
CPC ............ *H01S 3/302* (2013.01); *H01S 3/0675* (2013.01); *H01S 3/0811* (2013.01); *H01S 3/13013* (2019.08); *H01S 2301/03* (2013.01)

(58) Field of Classification Search
CPC .. H01S 3/1022; H01S 3/1301; H01S 3/13013; H01S 3/1312; H01S 2301/03
See application file for complete search history.

(56) References Cited

U.S. PATENT DOCUMENTS

| 6,429,926 B1* | 8/2002 | Williamson | G01F 1/661 |
| | | | 356/28 |
| 2005/0185901 A1* | 8/2005 | Inoue | B23K 26/032 |
| | | | 385/96 |
| 2018/0008132 A1* | 1/2018 | Sakai | G02B 6/42 |

FOREIGN PATENT DOCUMENTS

| JP | S60-201753 A | 10/1985 |
| JP | S61-269993 A | 11/1986 |
| JP | H03-119802 U | 12/1991 |
| JP | 2003-515757 A | 5/2003 |
| JP | 2004-170088 A | 6/2004 |
| JP | 2005-241822 A | 9/2005 |
| JP | 2009-016804 A | 1/2009 |
| JP | 2010-531469 A | 9/2010 |
| JP | 2010-278205 A | 12/2010 |
| JP | 2015-203844 A | 11/2015 |

(Continued)

OTHER PUBLICATIONS

An Office Action mailed by the Japanese Patent Office on May 19, 2020, which corresponds to Japanese Patent Application No. 2018-089131 and is related to U.S. Appl. No. 16/396,934; with English language.

*Primary Examiner* — Michael Carter
(74) *Attorney, Agent, or Firm* — Studebaker & Brackett PC

(57) ABSTRACT

A laser oscillator of the present invention comprises: a semiconductor laser module; a first optical fiber for propagating a laser beam from the semiconductor laser module; and a first prism including a first input surface fusion-bonded to the first optical fiber and receiving the laser beam having been input from the first optical fiber, a first reflection surface for reflecting the laser beam having been input from the first input surface and for transmitting a stimulated Raman scattered beam, and a first output surface for out- (Continued)

putting the laser beam having been reflected on the first reflection surface.

9 Claims, 7 Drawing Sheets

(56) References Cited

FOREIGN PATENT DOCUMENTS

| | | |
|---|---|---|
| WO | 2014/014068 A1 | 1/2014 |
| WO | 2016/151670 A1 | 9/2016 |

* cited by examiner

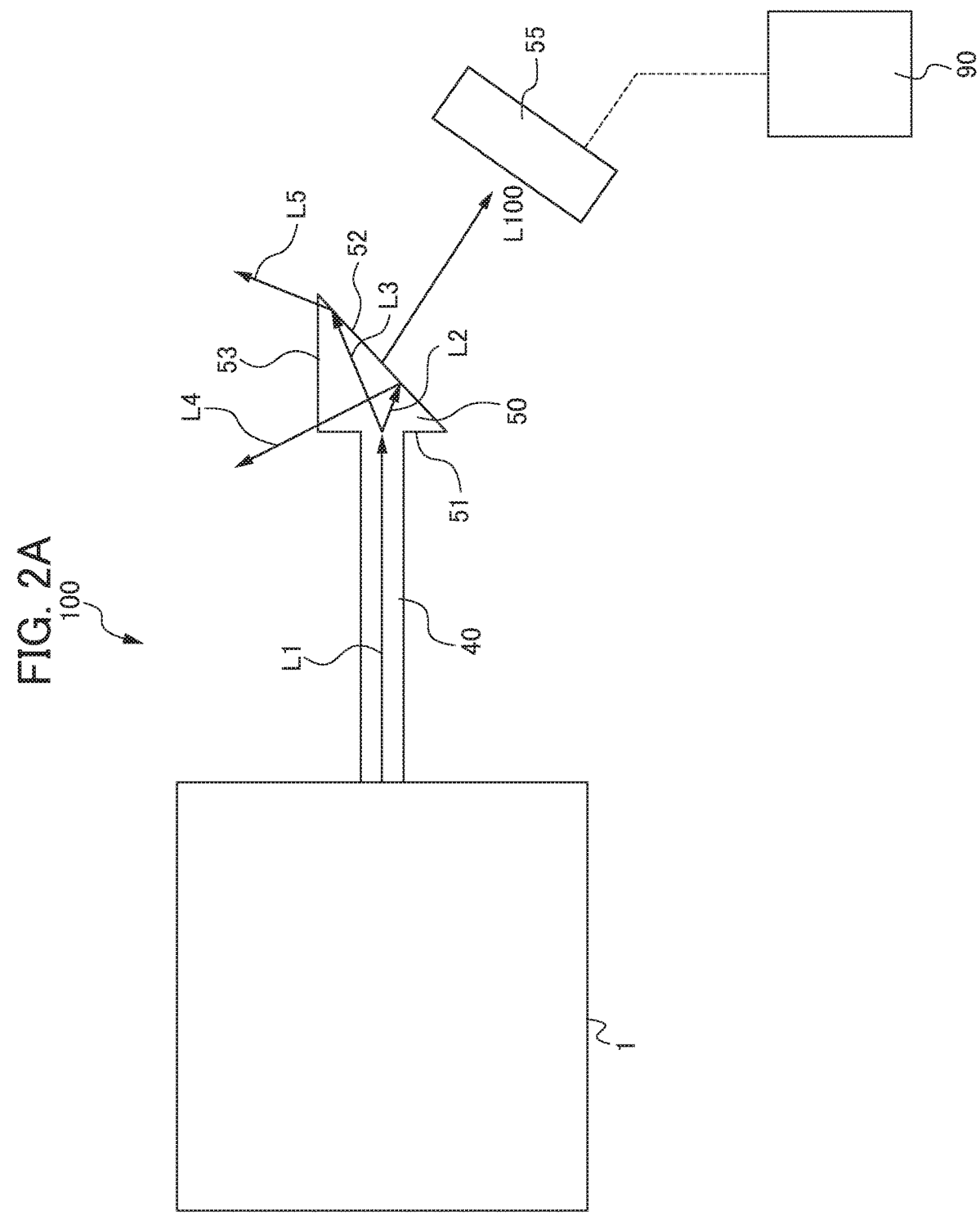

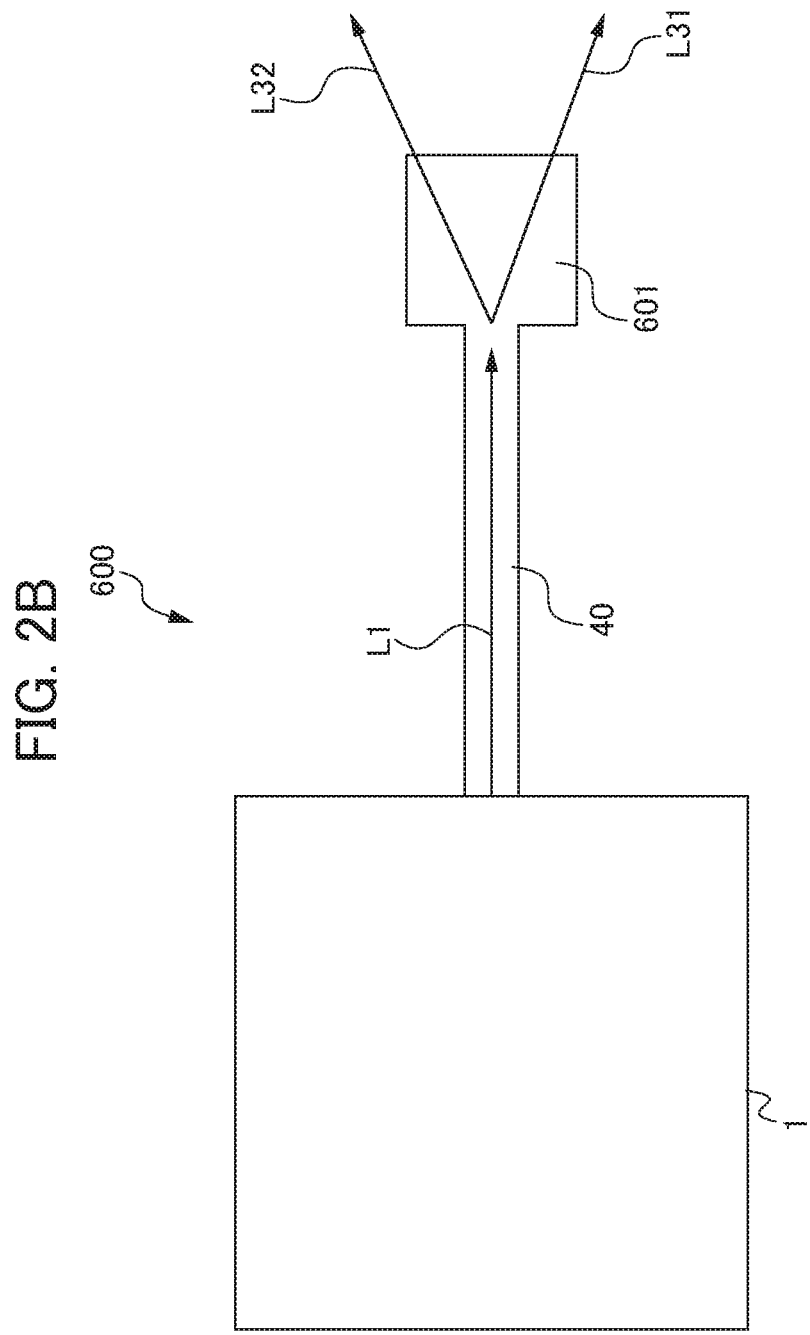

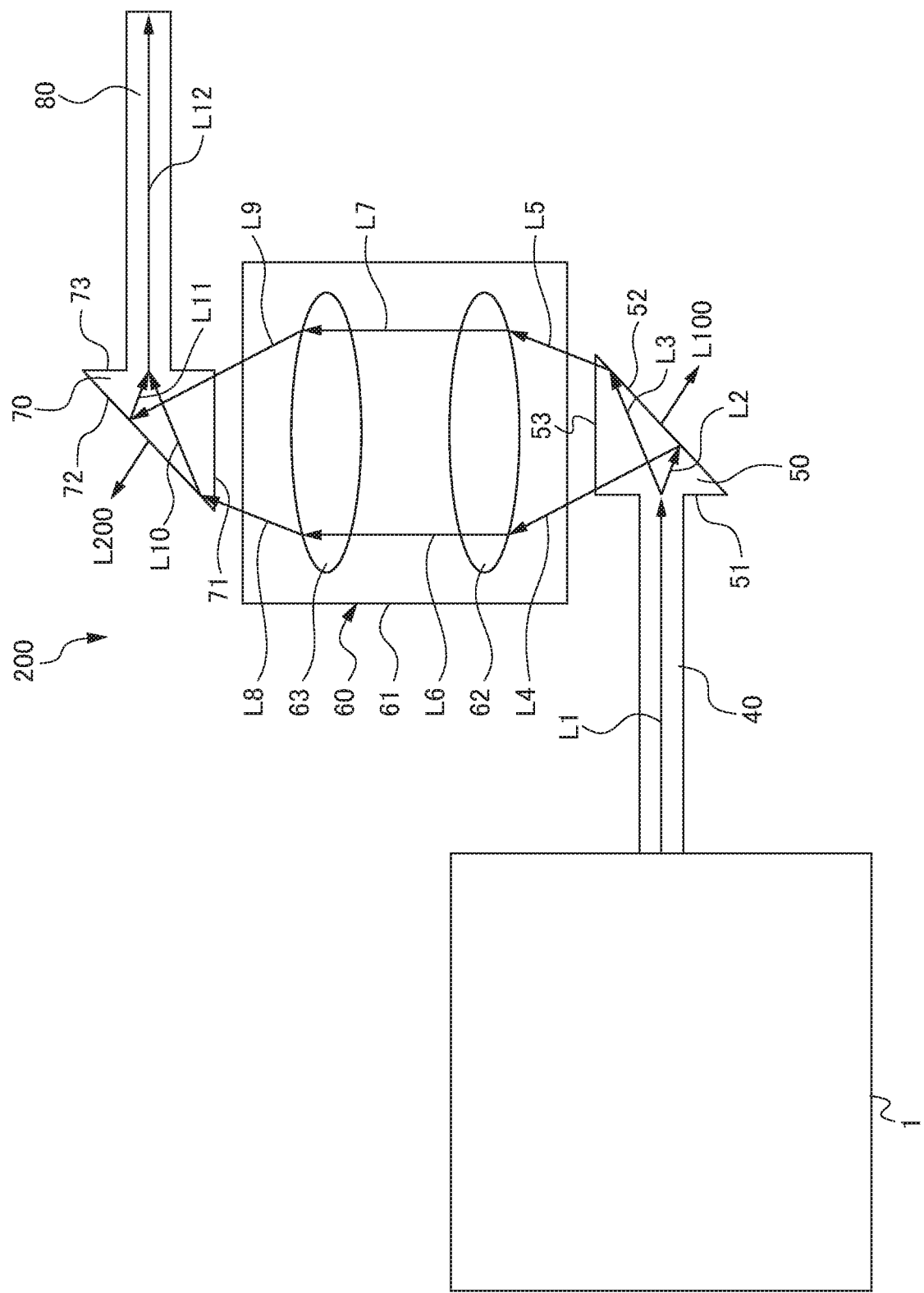

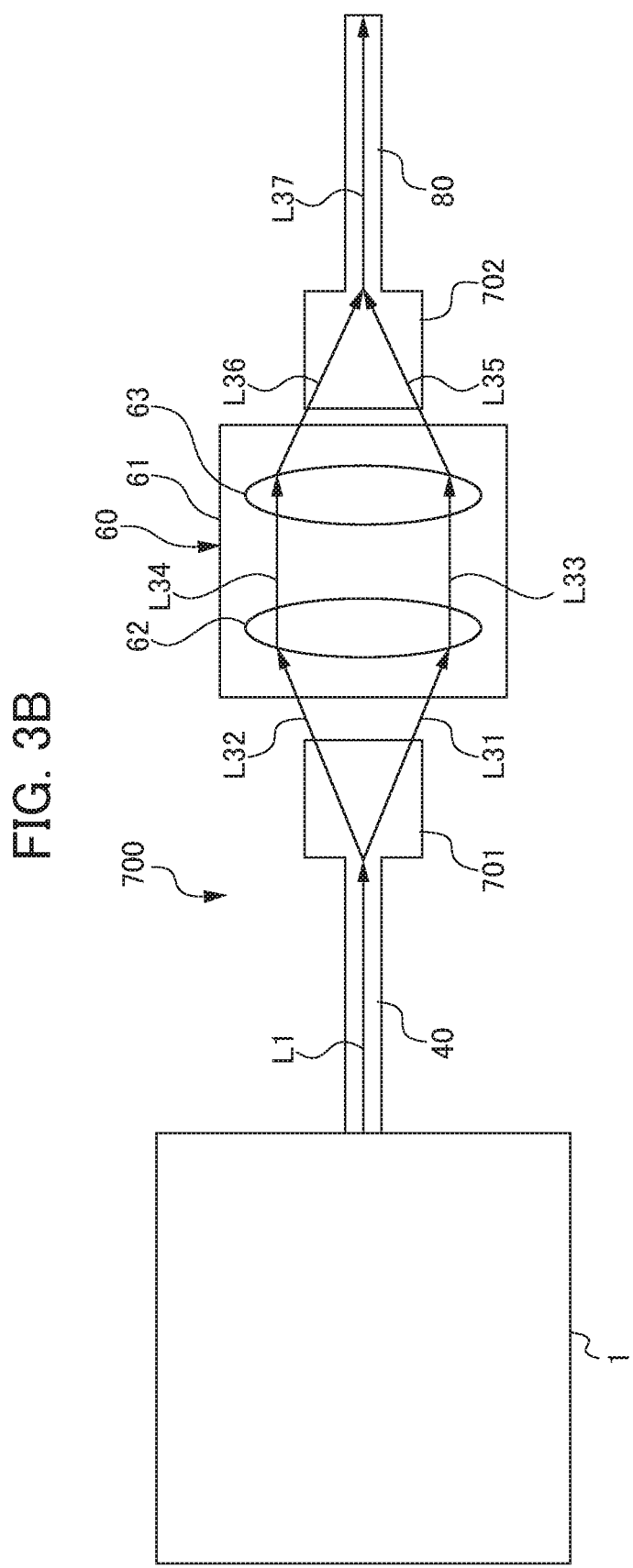

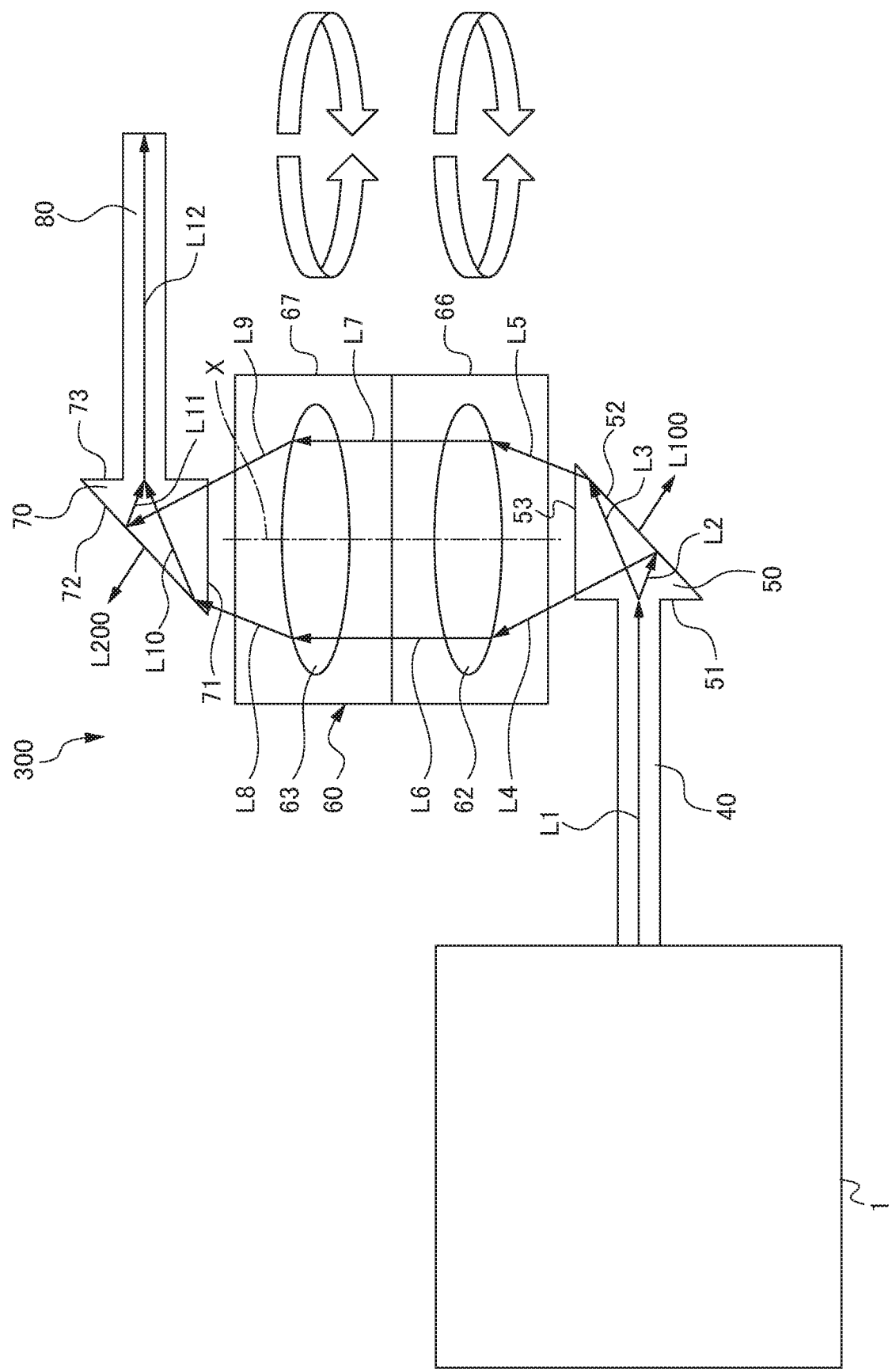

LASER OSCILLATOR

This application is based on and claims the benefit of priority from Japanese Patent Application No. 2018-089131, filed on 7 May 2018, the content of which is incorporated herein by reference.

BACKGROUND OF THE INVENTION

Field of the Invention

The present invention relates to a laser oscillator.

Related Art

In some cases, a laser oscillator has been used for cutting or welding a metallic material or a plastic material. A laser output from the laser oscillator may exceed 1 kW. The laser beam output from the laser oscillator may include a laser beam originally intended, and a stimulated Raman scattered beam having a different waveform from the originally intended laser beam. The inclusion of the stimulated Raman scattered beam reduces output of a laser beam, so that suppressing the stimulated Raman scattered beam is required. For this reason, a reflector at a fiber laser has been given a coating for reflecting the originally intended laser beam and a coating for transmitting the stimulated Raman scattered beam.

Patent document 1 is presented as a document relating to a light source device for attenuating the foregoing stimulated Raman scattered beam. Patent document 1 discloses a light source device in which an optical part having an insertion loss spectrum for attenuating a stimulated Raman scattered beam and for transmitting an excitation beam or an amplified beam is arranged on a propagation path for the stimulated Raman scattered beam.

Patent document 2 is presented as a document relating to an optical system given a coating for reflecting a laser beam and a coating for transmitting a stimulated Raman scattered beam. Patent document 2 discloses a gas component measuring device having a first concave mirror for reflecting a laser beam and for transmitting a stimulated Raman scattered beam.

Patent Document 1: Japanese Unexamined Patent Application, Publication No. 2009-016804

Patent Document 2: Japanese Unexamined Patent Application, Publication No. 2004-170088

SUMMARY OF THE INVENTION

However, adding a new optical part for suppressing a stimulated Raman scattered beam complicates a device configuration.

Thus, the present invention is intended to provide a laser oscillator capable of suppressing a stimulated Raman scattered beam while suppressing complication of a configuration.

(1) The present invention relates to a laser oscillator (laser oscillator 100, 200, 300, 400 described later, for example) comprising: a semiconductor laser module (semiconductor laser module 10 described later, for example); a first optical fiber (first optical fiber 40 described later, for example) for propagating a laser beam from the semiconductor laser module; and a first prism (first prism 50, 150 described later, for example) including a first input surface (first input surface 51 described later, for example) fusion-bonded to the first optical fiber and receiving the laser beam having been input from the first optical fiber, a first reflection surface (first reflection surface 52, 152 described later, for example) for reflecting the laser beam having been input from the first input surface and for transmitting a stimulated Raman scattered beam, and a first output surface (first output surface 53 described later, for example) for outputting the laser beam having been reflected on the first reflection surface.

(2) The laser oscillator described in (1) may comprise: an optical system (fiber coupler 60 described later, for example) for propagating the laser beam having been output from the first prism; a second prism (second prism 70, 170 described later, for example) including a second input surface (second input surface 71 described later, for example) for receiving the laser beam having been propagated through the optical system, a second reflection surface (second reflection surface 72, 172 described later, for example) for reflecting the laser beam having been input from the second input surface and for transmitting a stimulated Raman scattered beam, and a second output surface (second output surface 73 described later, for example) for outputting the laser beam having been reflected on the second reflection surface; and a second optical fiber (second optical fiber 80 described later, for example) to which the second output surface is fusion-bonded and used for propagating the laser beam. The first prism and the second prism may be attachable to and detachable from the optical system.

(3) In the laser oscillator described in (2), the optical system may include two housings (coupler housings 66, 67 described later, for example) having swivel configurations rotatable about a predetermined central axis (central axis X described later, for example), the first prism may be held by one of the two housings, and the second prism may be held by the other of the two housings.

(4) The laser oscillator described in any one of (1) to (3) may comprise: a detector (detector 55 described later, for example) arranged to face the first reflection surface of the first prism and detecting the intensity of the laser beam having been transmitted through the first reflection surface; a current supply unit (current supply unit 95 described later, for example) that supplies the semiconductor laser module with an excitation current; a changeover unit (switch units 111 to 115 described later, for example) capable of making a change between supplying the excitation current and not supplying the excitation current from the current supply unit to the semiconductor laser module; and a control unit (control unit 90 described later, for example). If the intensity of the beam detected by the detector exceeds a set value, the control unit may control the changeover unit to make a change to not supplying the excitation current to the semiconductor layer module, thereby stopping emission of a laser beam.

(5) In the laser oscillator (laser oscillator 400 described later, for example) described in (2) or (3), the first reflection surface (first reflection surface 152 described later, for example) may be configured as a first curved surface for reflecting the laser beam from the first optical fiber as parallel beams, and the second reflection surface (second reflection surface 172 described later, for example) may be configured as a second curved surface for reflecting the parallel beams of the laser beam from the first reflection surface and for focusing and coupling the reflected beams in the second optical fiber.

The laser oscillator provided by the present invention is capable of suppressing a stimulated Raman scattered beam while suppressing complication of a configuration.

BRIEF DESCRIPTION OF THE DRAWINGS

FIG. 2A is a sectional view schematically showing a part of the configuration of the laser oscillator according to the first embodiment of the present invention;

FIG. 2B is a sectional view schematically showing a part of the configuration of a laser oscillator according to a first comparative example;

FIG. 3A is a sectional view schematically showing a part of the configuration of a laser oscillator according to a second embodiment of the present invention;

FIG. 3B is a sectional view schematically showing a part of the configuration of a laser oscillator according to a second comparative example;

FIG. 4 is a sectional view schematically showing a part of the configuration of a laser oscillator according to a third embodiment of the present invention.

DETAILED DESCRIPTION OF THE INVENTION

Figure 1:
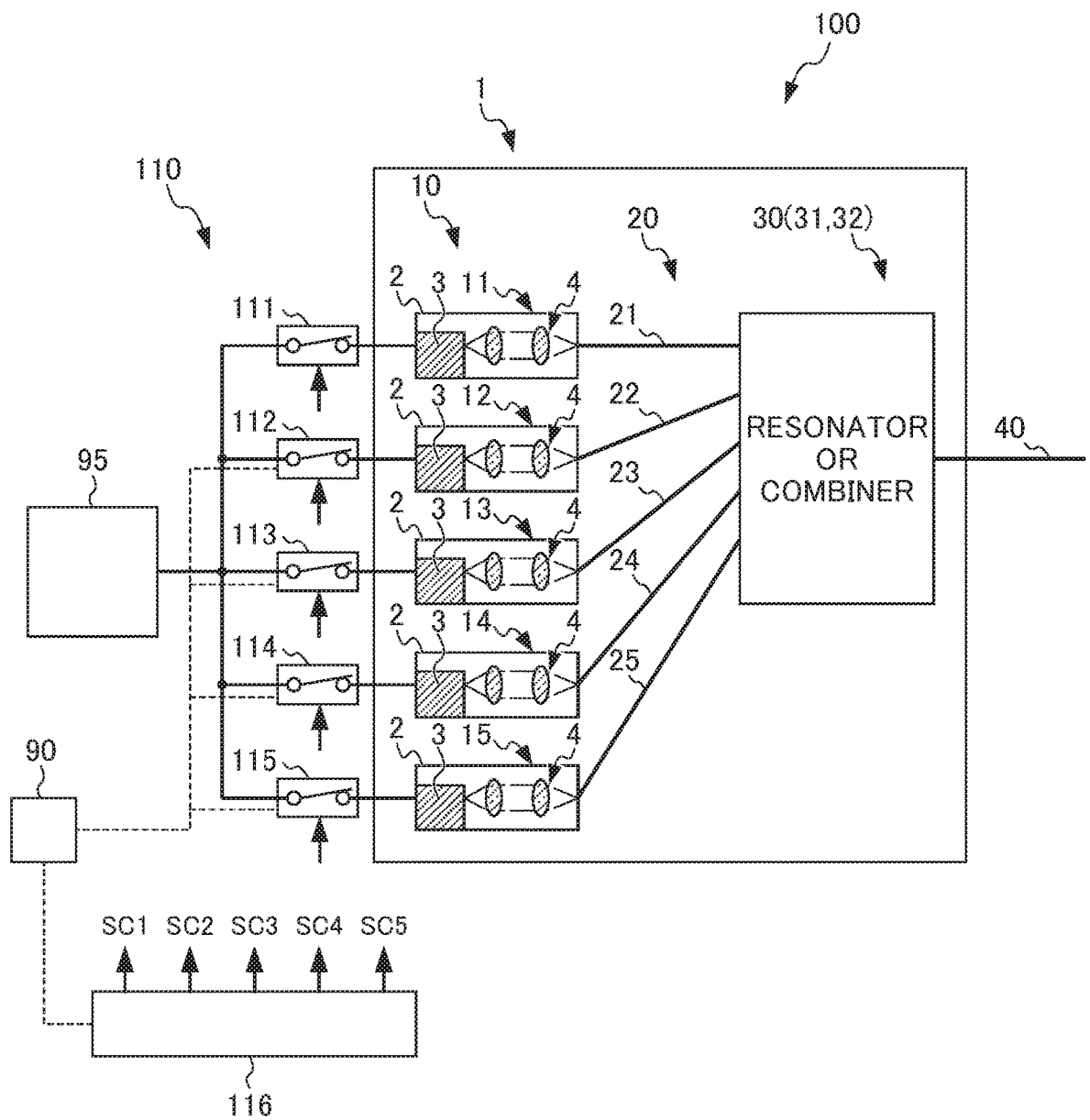
FIG. 1 is a schematic configuration view showing the configuration of a laser oscillator according to a first embodiment of the present invention.

Embodiments of the present invention will be described below by referring to the drawings. The present invention can be embodied in many different modes, and should not be limited to the contents of exemplary embodiments described below. After an element is described by referring to any of the drawings, an element comparable to the already-described element will be given the same sign in the description and the drawings, and the description of the comparable element will be omitted, where appropriate.

First Embodiment

[Overall Configuration of Laser Oscillator]

A laser oscillator according to a first embodiment of the present invention will be described by referring to the drawings. FIG. 1 is a schematic configuration view showing the laser oscillator according to the first embodiment of the present invention. FIG. 2A is a sectional view schematically showing a part of the configuration of the laser oscillator according to the first embodiment of the present invention. As shown in FIGS. 1 and 2A, a laser oscillator 100 according to the first embodiment includes a laser output unit 1, a module driver 110, a first optical fiber 40, and a first prism 50 (see FIG. 2A).

[Laser Output Unit]

The laser output unit 1 is a unit that outputs a laser beam. The laser output unit 1 includes multiple (in the illustration of the drawing, five) semiconductor laser modules 10 (11, 12, 13, 14, 15), an in-module optical fiber 20 (21, 22, 23, 24, 25), and a resonator or a combiner 30 (resonator 31, combiner 32).

[Semiconductor Laser Module]

The semiconductor laser module 10 (11, 12, 13, 14, 15) includes a housing 2, a semiconductor laser element 3, and a lens 4. The semiconductor laser element 3 emits a laser beam. The lens 4 refracts and focuses a laser beam from the semiconductor laser element 3. The housing 2 houses the semiconductor laser element 3 and the lens 4.

The semiconductor laser module 10 (11, 12, 13, 14, 15) forms a semiconductor laser module group including a mixture of semiconductor laser modules of different rated outputs. As a specific example, the semiconductor laser module group includes a mixture of a semiconductor laser module of 50 W and a semiconductor laser module of 100 W. While a laser output from a laser oscillator can be controlled only in units of 100 W using only the semiconductor laser module of 100 W, providing the semiconductor laser module of 50 W further like in this case allows control of a laser output in units of 50 W. By providing a semiconductor laser module of 10 W or less in the semiconductor laser module group, it becomes possible to control a laser output more finely. A laser output can also be controlled by controlling a current in the semiconductor laser module.

[In-Module Optical Fiber]

The in-module optical fiber 20 (21, 22, 23, 24, 25) is derived from the housing 2. The in-module optical fiber 20 (21, 22, 23, 24, 25) is for propagating a laser beam from the semiconductor laser module 10 (11, 12, 13, 14, 15), and for supplying the laser beam to the resonator or combiner 30 (resonator 31, combiner 32).

[Resonator or Combiner]

In the presence of the resonator 31, a laser beam from the semiconductor laser module 10 (11, 12, 13, 14, 15) is used as an excitation beam for the resonator 31. In the presence of only the combiner 32, laser beams from the multiple semiconductor laser modules 11, 12, 13, 14, and 15 are focused by the combiner 32 and used. Both the resonator 31 and the combiner 32 may be provided. By employing any of these methods, the laser oscillator 100 outputs a laser beam through the first optical fiber 40 for output.

[First Optical Fiber]

The first optical fiber 40 is for propagating (passing, guiding) a laser beam from the laser output unit 1 including the semiconductor laser module 10 (11, 12, 13, 14, 15).

[Module Driver]

The module driver 110 is a part that drives the multiple semiconductor laser modules 10 (11, 12, 13, 14, 15) individually.

The module driver 110 applies two control modes as follows selectively to each of the multiple semiconductor laser modules 10 (11, 12, 13, 14, 15) and executes the applied mode: a rated drive mode of driving the semiconductor laser module so as to produce a rated output (turning on a corresponding switch unit); and a stop mode of not driving the semiconductor laser module (turning off a corresponding switch unit). More specifically, the semiconductor laser module 10 (11, 12, 13, 14, 15) is to be placed only in one of the two states, an output OFF state and a rated output ON state. The module driver 110 includes a current supply unit 95 as a power supply, a switch unit 111, a switch unit 112, a switch unit 113, a switch unit 114, and a switch unit 115, a control signal generation unit 116, and a control unit 90.

[Current Supply Unit]

The current supply unit 95 is a unit that supplies the semiconductor laser element 3 of the semiconductor laser module 10 (11, 12, 13, 14, 15) with an excitation current.

[Switch Unit]

Each of the switch units 111, 112, 113, 114, and 115 as a changeover unit is a unit interposed in a circuit for supplying an excitation current from the current supply unit 95 to a corresponding one of the semiconductor laser modules 11, 12, 13, 14, and 15. Each of the switch units 111, 112, 113, 114, and 115 is a unit capable of making a change between supplying an excitation current and not supplying the excitation current from the current supply unit 95 to a corresponding one of the semiconductor laser modules 11, 12, 13, 14, and 15.

[Control Signal Generation Unit]

The control signal generation unit 116 is a unit that generates a control signal SC1, a control signal SC2, a control signal SC3, a control signal SC4, and a control signal SC5 for controlling corresponding ones of the switch units 111, 112, 113, 114, and 115.

[Control Unit]

The control unit 90 controls drive of the switch units 111, 112, 113, 114, and 115, and the control signal generation unit 116.

[First Prism]

The first prism 50 includes a first input surface 51, a first reflection surface 52, and a first output surface 53. The first input surface 51 is a surface for receiving an input laser beam. The first input surface 51 is fixed to the first optical fiber 40 by being fusion-bonded to the first optical fiber 40. The first reflection surface 52 is a surface for reflecting the laser beam having been input from the first input surface 51 and for transmitting a stimulated Raman scattered beam. In the first embodiment, the first reflection surface 52 is formed by being given multiple coatings. The first output surface 53 is a surface for outputting the laser beam having been reflected on the first reflection surface 52.

Supplemental explanation of the first reflection surface 52 will be given below. A stimulated Raman scattered beam (SRS beam) to be transmitted through the first reflection surface 52 is one type of scattered beam of a laser beam and is more likely to occur with increase in the intensity of the laser beam. The occurrence of the stimulated Raman scattered beam causes a problem that output of an originally intended laser beam is reduced. The stimulated Raman scattered beam becomes more intensified as it is propagated through an optical fiber, so that it is removed on the first reflection surface 52. After the laser beam is reflected on the first reflection surface 52, the component of the stimulated Raman scattered beam in the laser beam is reduced once. This prevents the stimulated Raman scattered beam from become more intensified during subsequent propagation of the stimulated Raman scattered beam.

Assuming that a laser beam has a wavelength of 1070 nm, a stimulated Raman scattered beam has a wavelength of 1120 nm. The first reflection surface 52 desirably causes reflection of 99.0% or more of the beam having a wavelength of 1070 nm, and desirably causes transmission of 97.0% or more of the beam having a wavelength of 1120 nm. The first reflection surface 52 is required to cause reflection of at least 98.0% or more of the beam having a wavelength of 1070 nm, and to cause transmission of 95.0% or more of the beam having a wavelength of 1120 nm.

The first reflection surface 52 causes transmission of a component having a wavelength except a wavelength of ±25 nm of that of a laser beam. The oscillation wavelength of the laser beam has a distribution of from about 5 nm to about 10 nm. Thus, by designing the first reflection surface 52 so as to achieve a reflectivity of 99.0% or more in a range of ±15 nm of the wavelength of the laser beam and to cause transmission of 97.0% or more of a beam having a wavelength except a wavelength of ±25 nm of that of the laser beam, it becomes possible to reduce a stimulated Raman scattered beam while suppressing loss of the laser beam.

[Detector]

As shown in FIG. 2A, the laser oscillator 100 includes a detector 55 in addition to the laser output unit 1, the first optical fiber 40, and the first prism 50 described above. The detector 55 is arranged to face the first reflection surface 52 of the first prism 50. The detector 55 detects the intensity of a laser beam having been transmitted through the first reflection surface 52. The detector 55 is configured using a photodiode, for example, capable of detecting the wavelength of a stimulated Raman scattered beam.

If the intensity of a stimulated Raman scattered beam detected by the detector 55 exceeds a set value, the control unit 90 controls the switch units 111, 112, 113, 114, and 115 to make a change to not supplying an excitation current to the semiconductor laser element 3 of the semiconductor layer module 10 (11, 12, 13, 14, 15), thereby stopping emission of a laser beam.

The following describes how a laser beam travels. The laser beam is output from the laser output unit 1 as indicated by an arrow L1, propagated through the first optical fiber 40, and then input to the interior of the first prism 50 in a spreading manner as indicated by an arrow L2 and an arrow L3. A stimulated Raman scattered beam is transmitted through the first reflection surface 52 as indicated by an arrow L100 and then released to the outside. The laser beam is reflected in a spreading manner on the first reflection surface 52 as indicated by an arrow L4 and an arrow L5, and then output through the first output surface 53.

The laser oscillator of the first embodiment achieves the following effect, for example. The laser oscillator 100 of the first embodiment includes: the semiconductor laser module 10 (11, 12, 13, 14, 15); the first optical fiber 40 for propagating a laser beam from the semiconductor laser module 10 (11, 12, 13, 14, 15); and the first prism 50 including the first input surface 51 fusion-bonded to the first optical fiber 40 and receiving the laser beam having been input from the first optical fiber 40, the first reflection surface 52 for reflecting the laser beam having been input from the first input surface 51 and for transmitting a stimulated Raman scattered beam, and the first output surface 53 for outputting the laser beam having been reflected on the first reflection surface 52.

Thus, the laser oscillator 100 provided by the first embodiment is capable of suppressing a stimulated Raman scattered beam while suppressing complication of a configuration. This eventually achieves maintenance or increase of a laser output from the laser oscillator 100.

The laser oscillator 100 of the first embodiment includes: the detector 55 arranged to face the first reflection surface 52 of the first prism 50 and detecting the intensity of the laser beam having been transmitted through the first reflection surface 52; the current supply unit 95 that supplies the semiconductor laser module 10 (11, 12, 13, 14, 15) with an excitation current; the switch units 111 to 115 each being capable of making a change between supplying the excitation current and not supplying the excitation current from the current supply unit 95 to the semiconductor laser module 10 (11, 12, 13, 14, 15); and the control unit 90. If the intensity of the beam detected by the detector 55 exceeds a set value, the control unit 90 controls the switch units 111 to 115 to make the change to not supplying the excitation current to the semiconductor layer module 10 (11, 12, 13, 14, 15), thereby stopping emission of a laser beam. A laser output can be controlled by controlling a current in the semiconductor laser module. Thus, the laser output can also be controlled by providing the current supply unit 95 with a current control function.

As a result of the control by the control unit 90, a stimulated Raman scattered beam is prevented from being guided at a high intensity in the laser oscillator 100 to reduce the occurrence of damage of the laser oscillator 100.

FIG. 2B is a sectional view schematically showing a part of the configuration of a laser oscillator 600 according to a first comparative example. The laser oscillator 600 includes the laser output unit 1, the first optical fiber 40, and a quartz block 601. The first optical fiber 40 is fusion-bonded to the quartz block 601. The first optical fiber 40 of this configuration is attached to the laser output unit 1. The following describes how a laser beam travels in the first comparative example. The laser beam is output from the laser output unit 1 as indicated by an arrow L1, propagated through the first optical fiber 40, and then input to the interior of the quartz block 601 in a spreading manner as indicated by an arrow L31 and an arrow L32. Then, the laser beam is output to the outside.

The laser beam is not emitted through a terminal surface of the first optical fiber 40 but is emitted through an end surface of the quartz block 601 in order to spread the laser beam in the quartz block 601 to reduce the intensity of the laser beam, and then emit the laser beam to the outside. Heat due to dirt or a nonreflective coating is easily generated at a boundary surface for emitting the laser beam to the outside. Thus, reducing the intensity of the laser beam is effective in preventing burning. The configuration of the first comparative example does not include a surface for transmitting a stimulated Raman scattered beam and guiding the stimulated Raman scattered beam to the outside, such as the first reflection surface 52 of the first prism 50 described above. Hence, the stimulated Raman scattered beam is to be emitted as it is from the quartz block 601. This is not preferable as it causes the risk of reduction of output from the laser oscillator 600.

Second Embodiment

FIG. 3A is a sectional view schematically showing a part of the configuration of a laser oscillator 200 according to a second embodiment of the present invention. As shown in FIG. 3A, the laser oscillator 200 includes a fiber coupler 60 as an optical system, a second prism 70, and a second optical fiber 80, in addition to the first optical fiber 40 and the first prism 50. The configuration of the laser oscillator 200 is similar in other respects to that of the first embodiment.

Thus, the description in the first embodiment is also applied herein and such a configuration of the laser oscillator 200 will not be described below.

[Fiber Coupler]

The fiber coupler 60 is for propagating a beam having been output from the first prism 50. The fiber coupler 60 is used for facilitating attachment and detachment of an optical fiber to and from the laser oscillator 200. The fiber coupler 60 includes a coupler housing 61, and a lens 62 and a lens 63 arranged in the coupler housing 61.

[Second Prism]

The second prism 70 includes a second input surface 71, a second reflection surface 72, and a second output surface 73. The second input surface 71 is a surface for receiving a laser beam having been propagated through the fiber coupler 60. The second reflection surface 72 is a surface for reflecting the laser beam having been input from the second input surface 71 and for transmitting a stimulated Raman scattered beam. In the second embodiment, the second reflection surface 72 is formed by being given multiple coatings. The second reflection surface 72 is formed in the similar way to the first reflection surface 52. The second output surface 73 is a surface for outputting the laser beam having been reflected on the second reflection surface 72. The second prism 70 is attachable to and detachable from the fiber coupler 60. The first prism 50 is also attachable to and detachable from the fiber coupler 60.

[Second Optical Fiber]

The second optical fiber 80 is fusion-bonded to the second output surface 73. The second optical fiber 80 is for propagating the laser beam having been transmitted through the fiber coupler 60.

The following describes how a laser beam travels in the second embodiment. The laser beam is output from the laser output unit 1 as indicated by an arrow L1, propagated through the first optical fiber 40, and then input to the interior of the first prism 50 in a spreading manner as indicated by an arrow L2 and an arrow L3. A stimulated Raman scattered beam is transmitted through the first reflection surface 52 as indicated by an arrow L100 and then released to the outside. The laser beam is reflected in a spreading manner on the first reflection surface 52 as indicated by an arrow L4 and an arrow L5, and then output through the first output surface 53.

As indicated by an arrow L6 and an arrow L7, the laser beam becomes parallel beams at the lens 62 of the fiber coupler 60. Then, the parallel beams are focused by the lens 63 of the fiber coupler 60 as indicated by an arrow L8 and an arrow L9, and then input to the second prism 70 through the second input surface 71. A stimulated Raman scattered beam is transmitted through the second reflection surface 72 as indicated by an arrow L200 and then released to the outside. The laser beams are reflected on the second reflection surface 72 as indicated by an arrow L10 and an arrow L11. Then, the reflected beams are focused in the second optical fiber 80 and propagated through the second optical fiber 80.

The laser oscillator of the second embodiment achieves the following effect, for example. The laser oscillator 200 of the second embodiment includes: the fiber coupler 60 for propagating a laser beam having been output from the first prism 50; the second prism 70 including the second input surface 71 for receiving the laser beam having been propagated through the fiber coupler 60, the second reflection surface 72 for reflecting the laser beam having been input from the second input surface 71 and for transmitting a stimulated Raman scattered beam, and the second output surface 73 for outputting the laser beam having been reflected on the second reflection surface 72; and the second optical fiber 80 to which the second output surface 73 is fusion-bonded and used for propagating the laser beam. The first prism 50 and the second prism 70 are configured to be attachable to and detachable from the fiber coupler 60.

As described above, the laser oscillator 200 of the second embodiment uses two prisms, the first prism 50 and the second prism 70 to reduce a stimulated Raman scattered beam, compared to the laser oscillator 100 of the first embodiment.

FIG. 3B is a sectional view schematically showing a part of the configuration of a laser oscillator 700 according to a second comparative example. The laser oscillator 700 includes the first optical fiber 40, a first quartz block 701, the fiber coupler 60, a second quartz block 702, and the second optical fiber 80. The following describes how a laser beam travels in the second comparative example. The laser beam is output from the laser output unit 1 as indicated by an arrow L1, propagated through the first optical fiber 40, and then input to the interior of the quartz block 701 in a spreading manner as indicated by an arrow L31 and an arrow L32. As indicated by an arrow L33 and an arrow L34, the laser beam becomes parallel beams at the lens 62 of the fiber coupler 60. While the parallel beams are focused by the lens 63 of the fiber coupler 60 as indicated by an arrow L35 and an arrow L36, the parallel beams are input to the second quartz block 702. Then, as indicated by an arrow L37, the resultant laser beam is propagated through the second optical fiber 80.

The quartz blocks 701 and 702 can be inserted into and removed from the fiber coupler 60. This produces an advantage that the quartz blocks 701 and 702 can be inserted and removed easily for change of the first optical fiber 40 and the second optical fiber 80. The configuration of the second comparative example does not include a surface for transmitting a stimulated Raman scattered beam and guiding the stimulated Raman scattered beam to the outside, such as the first reflection surface 52 of the first prism 50 and the second reflection surface 72 of the second prism 70. This is not preferable in terms of the probability that the stimulated Raman scattered beam will be coupled as it is to the second optical fiber 80.

Third Embodiment

FIG. 4 is a sectional view schematically showing the configuration of a laser oscillator 300 according to a third embodiment of the present invention. The laser oscillator 300 of the third embodiment differs from the laser oscillator 200 of the second embodiment in that the first prism 50 and the second prism 70 are held by the fiber coupler 60 having a swivel configuration. The configuration of the laser oscillator 300 is similar in other respects to that of the second embodiment. Thus, the description in the second embodiment is also applied herein and such a configuration of the laser oscillator 300 will not be described below.

The fiber coupler 60 of the laser oscillator 300 includes a coupler housing 66, a coupler housing 67, the lens 62, and the lens 63. The coupler housing 66 and the coupler housing 67 as two housings have swivel configurations with which one of the housings can rotate about a predetermined central axis X relative to the other. The first prism 50 is attached to the coupler housing 66 so as to be detachable from the coupler housing 66. The lens 62 is arranged in the coupler housing 66. The second prism 70 is attached to the coupler housing 67 so as to be detachable from the coupler housing 67. The lens 63 is arranged in the coupler housing 67.

Thus, the first prism 50, the coupler housing 66, and the lens 62 rotate integrally about the central axis X of the fiber coupler 60. The second prism 70, the coupler housing 67, and the lens 63 rotate integrally about the central axis X of the fiber coupler 60. The first prism 50 is held by the coupler housing 66 as one of the two housings. The second prism 70 is held by the coupler housing 67 as the other of the two housings.

The laser oscillator of the third embodiment achieves the following effect, for example. In the laser oscillator 300 of the third embodiment, the fiber coupler 60 includes the two coupler housings 66 and 67 having swivel configurations rotatable about the predetermined central axis X. The first prism 50 is held by the coupler housing 66 as one of the two coupler housings 66 and 67. The second prism 70 is held by the coupler housing 67 as the other of the two coupler housings 66 and 67.

Thus, the first prism 50 and the coupler housing 66 can rotate relative to the coupler housing 67, and the second prism 70 and the coupler housing 67 can rotate relative to the coupler housing 66. This allows the first optical fiber 40 fusion-bonded to the first prism 50 to rotate relative to the coupler housing 67, and allows the second optical fiber 80 fusion-bonded to the second prism 70 to rotate relative to the coupler housing 66.

By the presence of the first prism 50, a direction in which the first optical fiber 40 extends and the optical axis direction of the fiber coupler 60 are arranged at an angle of 90°. This allows a manufacturer to arrange the first optical fiber 40 in an intended direction so as to rotate the first optical fiber 40 about the optical axis of the fiber coupler 60. By the presence of the second prism 70, a direction in which the second optical fiber 80 extends and the optical axis direction of the fiber coupler 60 are arranged at an angle of 90°. This allows the manufacturer to arrange the second optical fiber 80 in an intended direction so as to rotate the second optical fiber 80 about the optical axis of the fiber coupler 60. As the first optical fiber 40 and the second optical fiber 80 can rotate freely, twists of the first optical fiber 40 and the second optical fiber 80 are suppressed.

Fourth Embodiment

Figure 5:
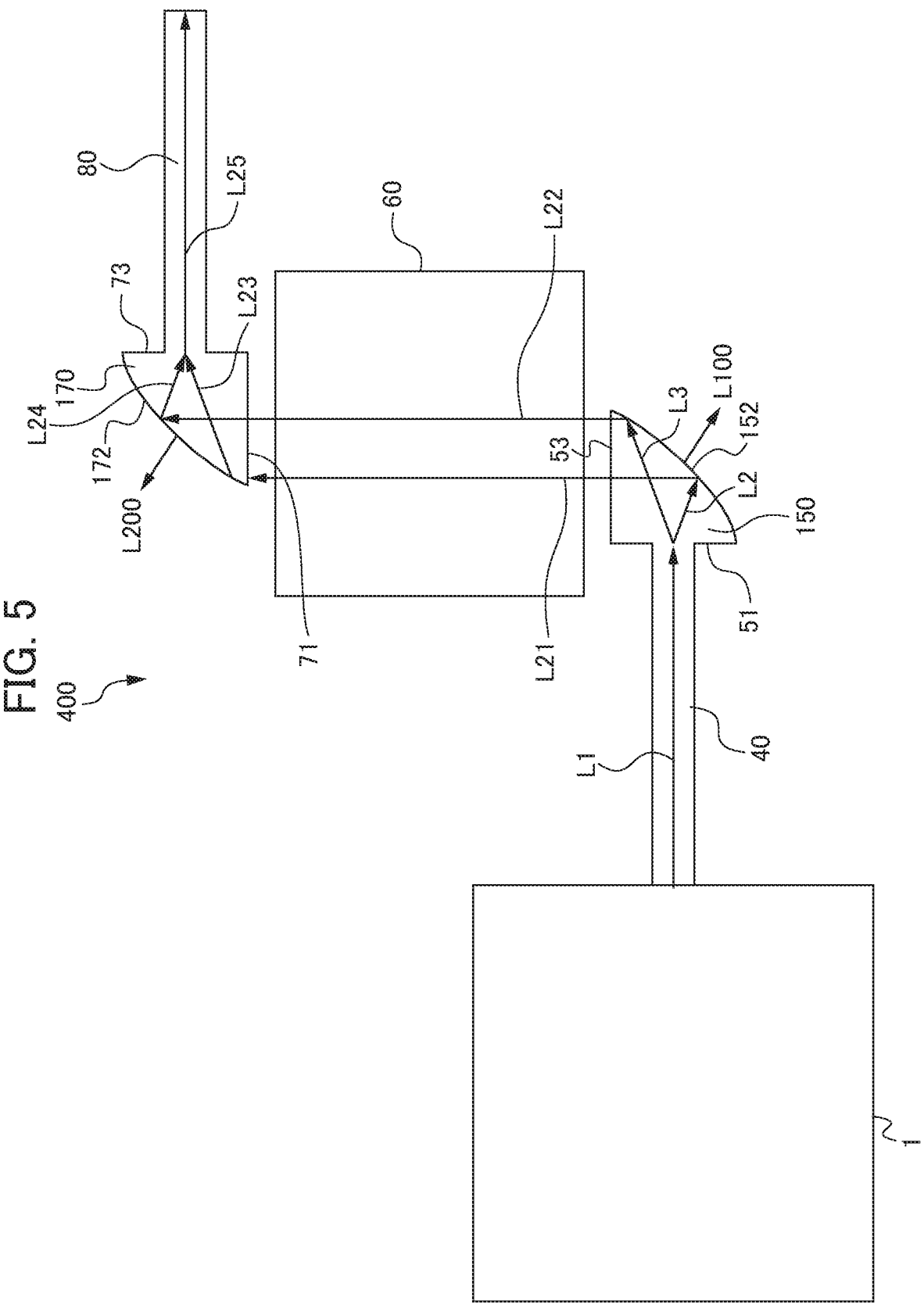
FIG. 5 is a sectional view schematically showing a part of the configuration of a laser oscillator according to a fourth embodiment of the present invention.

FIG. 5 is a sectional view schematically showing a part of the configuration of a laser oscillator 400 according to a fourth embodiment of the present invention. The laser oscillator 400 of the fourth embodiment differs from the laser oscillator 200 of the second embodiment and the laser oscillator 300 of the third embodiment in that the first prism 50 and the second prism 70 are replaced by a first prism 150 and a second prism 170. The configuration of the laser oscillator 400 is similar in other respects to those of the second embodiment and the third embodiment. Thus, the descriptions in the second embodiment and the third embodiment are also applied herein and such a configuration of the laser oscillator 400 will not be described below.

The first prism 150 includes a first reflection surface 152. The first reflection surface 152 is configured as a first curved surface for reflecting a laser beam from the first optical fiber 40 as parallel beams. The second prism 170 includes a second reflection surface 172. The second reflection surface 172 is configured as a second curved surface for reflecting the parallel beams of the laser beam from the first reflection surface 152 and for focusing and coupling the reflected beams in the second optical fiber 80. A lens is not arranged in the fiber coupler 60.

The following describes how a laser beam travels in the fourth embodiment. The laser beam is output from the laser output unit 1 as indicated by an arrow L1, propagated through the first optical fiber 40, and then input to the interior of the first prism 50 in a spreading manner as indicated by an arrow L2 and an arrow L3. A stimulated Raman scattered beam is transmitted through the first reflection surface 152 as indicated by an arrow L100 and then released to the outside. The laser beam is reflected on the first reflection surface 152 as indicated by an arrow L21 and an arrow L22. Then, resultant parallel beams are output through the first output surface 53. The reflection surface 152 is a curved surface for converting the spread laser beam to parallel beams. Thus, after reflection on the reflection surface 152, the laser beam becomes parallel beams.

The parallel beams of the laser beam pass through the fiber coupler 60 as they are as indicated by the arrows L21 and L22, and then input to the second prism 170. A stimulated Raman scattered beam is transmitted through the second reflection surface 172 as indicated by an arrow L200 and then released to the outside. The laser beams are reflected on the second reflection surface 172 as indicated by an arrow L23 and an arrow L24. Then, the reflected beams are focused in the second optical fiber 80 and propagated through the second optical fiber 80. The reflection surface 172 is a curved surface allowing focusing of the laser beam as the parallel beams so as to couple the parallel beams in the second optical fiber 80. Thus, after reflection on the reflection surface 172, the laser beams are coupled in the second optical fiber 80.

The laser oscillator of the fourth embodiment achieves the following effect, for example. In the laser oscillator 400 of the fourth embodiment, the first reflection surface 152 is configured as the first curved surface for reflecting a laser beam from the first optical fiber 40 as parallel beams. The second reflection surface 172 is configured as the second curved surface for reflecting the parallel beams of the laser beam from the first reflection surface 152 and for focusing and coupling the reflected beams in the second optical fiber 80.

Thus, the laser beam as the parallel beams passes through the fiber coupler 60. As the laser beam passing through the fiber coupler 60 is in the form of the parallel beams, a lens is not required in the fiber coupler 60. Making a lens unnecessary makes it possible to prevent a stimulated Raman scattered beam from being amplified further due to reflection of the stimulated Raman scattered beam on a surface of a lens and return of the stimulated Raman scattered beam toward a resonator.

[Modifications]

The embodiments of the present invention have been described above. In each the first to fourth embodiments, the laser oscillator includes the control unit. However, this configuration is not restrictive. The control unit may be provided separately from the laser oscillator.

In the first to fourth embodiments, the first reflection surface 52, the second reflection surface 72, the first reflection surface 152, and the second reflection surface 172 are formed by being given coatings. However, this configuration is not restrictive. Each of these reflection surfaces may be formed by a diffraction grating (grating).

In the first embodiment, the control unit 90 is configured in such a manner that, if the intensity of a beam detected by the detector 55 exceeds the set value, the control unit 90 controls the switch units 111 to 115 to make a change to not supplying an excitation current to the semiconductor laser module 10 (11, 12, 13, 14, 15), thereby stopping emission of a laser beam. However, this configuration is not restrictive. More specifically, the control unit 90 may be configured to control any of the switch units 111 to 115 partially to make a change to not supplying an excitation current to any of the semiconductor laser modules 10 (11, 12, 13, 14, 15), thereby reducing emission of a laser beam.

EXPLANATION OF REFERENCE NUMERALS

40 First optical fiber
50 First prism
51 First input surface
52 First reflection surface
53 First output surface
55 Detector
60 Fiber coupler (optical system)
66, 67 Coupler housing (housing)
70 Second prism
71 Second input surface
72 Second reflection surface
73 Second output surface
80 Second optical fiber
90 Control unit
95 Current supply unit
100, 200, 300, 400, 500, 600, 700 Laser oscillator
111 to 115 Switch unit (changeover unit)
150 First prism
152 First reflection surface
170 Second prism
172 Second reflection surface

What is claimed is:

1. A laser oscillator comprising: a semiconductor laser module;
   a first optical fiber for propagating a laser beam from the semiconductor laser module;
   a first prism including a first input surface fusion-bonded to the first optical fiber and receiving the laser beam having been input from the first optical fiber, a first reflection surface for reflecting the laser beam having been input from the first input surface and for transmitting a stimulated Raman scattered beam, and a first output surface for outputting the laser beam having been reflected on the first reflection surface;
   an optical system for propagating the laser beam having been output from the first prism;
   a second prism including a second input surface for receiving the laser beam having been propagated through the optical system, a second reflection surface for reflecting the laser beam having been input from the second input surface and for transmitting a stimulated Raman scattered beam, and a second output surface for outputting the laser beam having been reflected on the second reflection surface; and
   a second optical fiber to which the second output surface is fusion-bonded and used for propagating the laser beam, the first prism and the second prism configured to be attachable to and detachable from the optical system.

2. The laser oscillator according to claim 1, wherein the optical system includes two housings having swivel configurations rotatable about a predetermined central axis;
   the first prism is held by one of the two housings; and
   the second prism is held by the other of the two housings.

3. The laser oscillator according to claim 1, comprising: a detector arranged to face the first reflection surface of the first prism and detecting the intensity of the laser beam having been transmitted through the first reflection surface;
   a current supply unit that supplies the semiconductor laser module with an excitation current;
   a changeover unit capable of making a change between supplying the excitation current and not supplying the excitation current from the current supply unit to the semiconductor laser module; and
   a control unit, if the intensity of the beam detected by the detector exceeds a set value, the control unit controlling the changeover unit to make the change to not supplying the excitation current to the semiconductor layer module, thereby stopping emission of a laser beam.

4. The laser oscillator according to claim 1, wherein the first reflection surface is configured as a first curved surface for reflecting the laser beam from the first optical fiber as parallel beams, and
   the second reflection surface is configured as a second curved surface for reflecting the parallel beams of the laser beam from the first reflection surface and for focusing and coupling the reflected beams in the second optical fiber.

5. A laser oscillator comprising: a semiconductor laser module;

a first optical fiber for propagating a laser beam from the semiconductor laser module; and a first prism including a first input surface fusion-bonded to the first optical fiber and receiving the laser beam having been input from the first optical fiber, a first reflection surface for reflecting the laser beam having been input from the first input surface and for transmitting a stimulated Raman scattered beam to an empty space directly outside of the first prism at a non-zero angle with respect to the laser beam having been input from the first optical fiber, and a first output surface for outputting the laser beam having been reflected on the first reflection surface.

6. The laser oscillator according to claim 5, comprising:
an optical system for propagating the laser beam having been output from the first prism;
  a second prism including a second input surface for receiving the laser beam having been propagated through the optical system, a second reflection surface for reflecting the laser beam having been input from the second input surface and for transmitting a stimulated Raman scattered beam, and a second output surface for outputting the laser beam having been reflected on the second reflection surface; and
  a second optical fiber to which the second output surface is fusion-bonded and used for propagating the laser beam, the first prism and the second prism configured to be attachable to and detachable from the optical system.

7. The laser oscillator according to claim 5, wherein the optical system includes two housings having swivel configurations rotatable about a predetermined central axis;
  the first prism is held by one of the two housings; and
  the second prism is held by the other of the two housings.

8. The laser oscillator according to claim 5, comprising:
a detector arranged to face the first reflection surface of the first prism and detecting the intensity of the laser beam having been transmitted through the first reflection surface;
  a current supply unit that supplies the semiconductor laser module with an excitation current;
  a changeover unit capable of making a change between supplying the excitation current and not supplying the excitation current from the current supply unit to the semiconductor laser module; and
  a control unit, if the intensity of the beam detected by the detector exceeds a set value, the control unit controlling the changeover unit to make the change to not supplying the excitation current to the semiconductor layer module, thereby stopping emission of a laser beam.

9. The laser oscillator according to claim 5, wherein the first reflection surface is configured as a first curved surface for reflecting the laser beam from the first optical fiber as parallel beams, and
  the second reflection surface is configured as a second curved surface for reflecting the parallel beams of the laser beam from the first reflection surface and for focusing and coupling the reflected beams in the second optical fiber.

* * * * *